(12) United States Patent
Yano et al.

(10) Patent No.: US 6,544,804 B2
(45) Date of Patent: Apr. 8, 2003

(54) SEMICONDUCTOR WAFER HAVING IDENTIFICATION INDICATION AND METHOD OF MANUFACTURING THE SAME

(75) Inventors: Hiroyuki Yano, Yokohama (JP); Katsuya Okumura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/878,227

(22) Filed: Jun. 12, 2001

(65) Prior Publication Data

US 2001/0036677 A1 Nov. 1, 2001

Related U.S. Application Data

(62) Division of application No. 09/050,035, filed on Mar. 30, 1998, now Pat. No. 6,268,641.

(51) Int. Cl.[7] .......................... H01L 21/66; H01L 21/76; H01L 29/30; G06K 7/10
(52) U.S. Cl. .................. 438/14; 438/16; 438/401; 148/33.2; 235/462.45
(58) Field of Search ......................... 438/19, 101, 459, 438/14, 16, 401; 257/48; 235/462.45; 148/33.2

(56) References Cited

U.S. PATENT DOCUMENTS

| | | | |
|---|---|---|---|
| 3,112,850 A | | 12/1963 | Garibotti |
| 3,597,045 A | | 8/1971 | Mathisen |
| 4,010,355 A | | 3/1977 | Roehrman et al. |
| 4,418,467 A | | 12/1983 | Iwai |
| 4,510,673 A | * | 4/1985 | Shils et al. ................. 29/574 |
| 4,543,464 A | | 9/1985 | Takeuchi |
| 4,567,361 A | * | 1/1986 | Rosenthal ................. 235/462 |
| 4,585,931 A | * | 4/1986 | Duncan et al. ............ 235/464 |
| 4,794,238 A | | 12/1988 | Hampton |
| 4,812,631 A | | 3/1989 | Hiramatsu |
| 4,825,093 A | | 4/1989 | Kiriseko et al. |
| 5,109,149 A | | 4/1992 | Leung |
| 5,175,774 A | | 12/1992 | Truax et al. |
| 5,229,306 A | | 7/1993 | Lindberg et al. |
| 5,329,090 A | | 7/1994 | Woelki et al. |
| 5,821,167 A | | 10/1998 | Fukami et al. |
| 5,876,819 A | | 3/1999 | Kimura et al. |
| 6,004,405 A | * | 12/1999 | Oishi et al. ................ 148/33.2 |
| 6,283,374 B1 | * | 9/2001 | Fantone et al. ........ 235/462.45 |

FOREIGN PATENT DOCUMENTS

| | | | | |
|---|---|---|---|---|
| JP | 58169924 | * | 10/1983 | ........... H01L/21/66 |
| JP | 63313812 | * | 12/1988 | ........... H01L/21/02 |

* cited by examiner

*Primary Examiner*—Olik Chaudhuri
*Assistant Examiner*—Brooke Kebede
(74) *Attorney, Agent, or Firm*—Banner & Witcoff, Ltd.

(57) ABSTRACT

An identification indication is formed on a side surface of a semiconductor wafer, and thus even if various treatment processes are repeatedly conducted for forming a semiconductor circuit, or even by the wrapping treatment on the rear side of the wafer, the identification indication cannot disappear or become unclear so that the identification indication can be clearly recognized at least until the process for cutting the wafer into chips.

9 Claims, 10 Drawing Sheets

US 6,544,804 B2

SEMICONDUCTOR WAFER HAVING IDENTIFICATION INDICATION AND METHOD OF MANUFACTURING THE SAME

This application is a divisional application of U.S. Ser. No. 09/050,035, filed Mar. 30, 1998, that issued on Jul. 31, 2001, as U.S. Pat. No. 6,268,641, the contents of which are incorporated herein by reference.

BACKGROUND OF THE INVENTION

The present invention relates to a semiconductor wafer having an identification indication and a method of manufacturing a semiconductor wafer having an identification indication.

Conventionally, an individual identification indication such as numerals and bar codes is applied to each semiconductor wafer before forming a semiconductor circuit on the semiconductor wafer so as to identify each semiconductor wafer. The indication is provided by engraving the front surface or the rear surface of the semiconductor wafer, in general, by means of laser beam radiation. However, various treatment processes are applied to the semiconductor wafer thereafter in order to form a semiconductor circuit in each chip area. After the treatment processes, the identification indication disappears or becomes unclear so that the recognition of the identification indication becomes difficult.

FIGS. 14 and 15 show a conventional semiconductor wafer 104 with a chip pattern 102 and an identification indication 16 formed on the surface of the semiconductor wafer 104. The identification indication 16 is formed by engraving the wafer 104 by laser beam radiation. A layer film (single layer or multi-layer) such as an insulating film 106 is formed on the semiconductor wafer surface having the identification indication 16. FIG. 14 is a diagram showing the surface of the semiconductor wafer 104 with engraving, that is, the identification indication 16 formed thereon by the laser beam radiation. FIG. 15 is an enlarged cross-sectional view of a part of the engraved portion, that is, the identification indication 16 portion on the semiconductor wafer surface of FIG. 14. As shown in the cross-sectional view of FIG. 15, the wafer 104 is engraved by the laser beam substantially vertically with respect to the surface with a clear outline so that the indication can be read accurately before forming the insulating film 106. However, if the insulating film 106 is formed on the semiconductor wafer surface, it is difficult to accurately reflect the outline of the engraved portion on the semiconductor wafer surface to the surface of the insulating film 106 so that the outline reflected on the insulating film 106 surface becomes unclear with dull corners. Therefore, it is difficult to read the indication accurately after forming the thin film. That is, if the insulating film 106 is formed by the CVD technology, the outline of the groove portion is ruined so that the outline of the insulating film 106 becomes a smooth mountain-like shape as shown in the cross-sectional view of FIG. 15. Also, the outline of the engraving formed on the substrate surface becomes unclear, and thus accurate reading becomes difficult.

FIG. 16 shows the state where the surface of the insulating film 106 is applied with the CMP treatment, and further, a metal film 108 of, for example, Al is formed thereon in the cross-sectional structure of FIG. 14. In this case, since the surface of the insulating film 106 is flattened by the CMP treatment, the surface of the metal film formed on the insulating film 106 can be flat as well. Therefore, when the CMP treatment is applied, the outline of the identification indication 16, that is, the engraved portion disappears on the metal film so that the identification indication 16 cannot be read out.

FIG. 17 shows the semiconductor wafer surface with a chip pattern 102 formed on the entirety thereof so as to minimize the loading effect of the RIE treatment and/or the CMP treatment. By forming the chip pattern on the entirety of the semiconductor wafer surface, the outline of the engraving of the identification indication 16 formed on the semiconductor wafer surface before forming the chip pattern becomes unclear as the semiconductor circuit formation treatment process proceeds on the wafer surface so that the accurate reading of the identification indication 16 becomes difficult.

FIG. 18 is a plan view of the semiconductor wafer surface with the engraving formed thereon. FIG. 19 is an enlarged cross-sectional view of a part of the engraved portion. If the engraving is formed on the surface of the semiconductor wafer 104 by the laser beam radiation, actually not only the groove but also a bump (uplift) 202 is formed in the engraved portion as shown in FIG. 19. Due to the bump 202, the homogeneity of the flatness is deteriorated in the subsequent CMP treatment. That is, since an abrading pad (not illustrated) of an abrading device cannot or hardly makes contact with the rear part of the semiconductor wafer 104 at the time of contacting and abrading the bump 202 of the engraved portion due to the height of the bump 202, an under polish is generated on the semiconductor wafer surface portion in the vicinity of the bump 202. Furthermore, when attaching such a wafer with a bump on a stage in a stepper, the bump portion of the wafer rises so that the light beam cannot be focused well in the lithography.

FIG. 20 is a side view of the semiconductor wafer 104 where the identification indication 16 is formed by engraving the rear surface of the semiconductor wafer 104 by the laser beam radiation. The rear surface of the semiconductor is, however, applied with the wrapping treatment (backside grinding) preceding the packaging, and thus by the wrapping treatment, the wafer 104 (such as a silicon substrate) usually having about 725 um thickness becomes thinner to about 300 um thickness. By the wrapping treatment, the identification indication 16 by engraving is completely eliminated without remaining until the cutting and separating process of the wafer 104 into chips.

As heretofore mentioned, in the case the identification indication 16 is formed on the surface of the wafer, the outline of the engraving on the semiconductor wafer surface disappears or becomes unclear by the subsequent processes on the wafer surface for forming a semiconductor circuit so that it becomes difficult to read the identification indication 16. On the other hand, in the case the identification indication 16 is formed on the rear side of the wafer, the identification indication 16 by engraving completely disappears by the wrapping treatment of the wafer rear surface preceding the packaging and thus it is impossible to read the identification indication 16.

BRIEF SUMMARY OF THE INVENTION

In order to solve the above-mentioned problems, an object of the present invention is to provide a semiconductor wafer having an identification indication capable of maintaining the identification indication formed by engraving in a clearly recognizable state until the wafer is cut and separated into chips without having the identification indication for identifying the wafer disappear or become unclear even after the treatment process on the wafer surface for forming a semiconductor circuit, or even after the treatment process after the wrapping treatment process on the wafer rear surface, and a method of manufacturing a semiconductor wafer having an identification indication.

In order to achieve the above-mentioned object, in the present invention, the identification indication for identifying the semiconductor wafer is formed on a selected side surface portion of the semiconductor wafer to remain after performing the semiconductor wafer abrading treatment from the rear side for making the semiconductor wafer thinner.

The present invention is to provide a semiconductor wafer having a semiconductor wafer identification indication on a selected side surface portion of the semiconductor wafer to remain after performing the semiconductor wafer abrading treatment from the rear side for making the semiconductor wafer thinner.

The side surface of the semiconductor wafer may have a slant face portion elongating from the front surface, a slant face portion elongating from the rear surface, and a peripheral surface portion between the slant face portion elongating from the front surface and the slant face portion elongating from the rear surface, and the selected side surface portion may be the slant face portion elongating from the front surface. The side surface of the semiconductor wafer may have a slant face portion elongating from the front surface, a slant face portion elongating from the rear surface, and a peripheral surface portion between the slant face portion elongating from the front surface and the slant face portion elongating from the rear surface, and the selected side surface portion may be a portion at the side close to the slant face portion elongating from the front surface. The identification indication may be an engraving formed on the selected side surface portion of the semiconductor wafer. The engraving may be formed by the laser beam radiation to the selected side surface portion of the semiconductor wafer. The identification indication may include an indication readily recognized visibly. The identification indication readily recognized visibly may include a numeral, a mark, and the like. The identification indication may include an indication readily recognized optically. The identification indication may include an identification indication readily recognized by a laser beam. The indication readily recognized optically or by a laser beam may include a bar code.

Furthermore, the present invention provides a method of manufacturing a semiconductor device comprising the steps of forming a semiconductor wafer identification indication on a selected side surface portion to remain after the semiconductor wafer abrading treatment from the rear surface for having the semiconductor wafer thinner, forming a semiconductor circuit on a chip area portion of the semiconductor wafer, examining whether a treatment is processed normally or a defect is generated after each treatment step of the series of treatment steps as well as recognizing the identification indication of the semiconductor wafer for identifying the semiconductor wafer for detecting the semiconductor wafer where a defect is generated, and cutting and separating the semiconductor wafer into semiconductor chips after forming a semiconductor circuit in a chip area portion of the semiconductor wafer.

The side surface of the semiconductor may have a slant face portion elongating from the front surface, a slant face portion elongating from the rear surface, and a peripheral surface portion between the slant face portion elongating from the front surface and the slant face portion elongating from the rear surface, and the selected side surface portion may be the slant face portion elongating from the front surface. The side surface of the semiconductor may have a slant face portion elongating from the front surface, a slant face portion elongating from the rear surface, and a peripheral surface portion between the slant face portion elongating from the front surface and the slant face portion elongating from the rear surface, and the selected side surface portion may be a portion at the side close to the slant face portion elongating from the front surface. The identification indication may be an engraving formed on the selected side surface portion of the semiconductor wafer. The engraving may be formed by applying laser beam radiation to the selected side surface portion of the semiconductor wafer. The identification indication may include an indication readily recognized visibly. The identification indication readily recognized visibly may include a numeral, a mark, and the like. The identification indication may include an indication readily recognized optically. The indication readily recognized optically may include a bar code.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter embodiments of the present invention will be explained with reference to the accompanying drawings.

Figure 1:
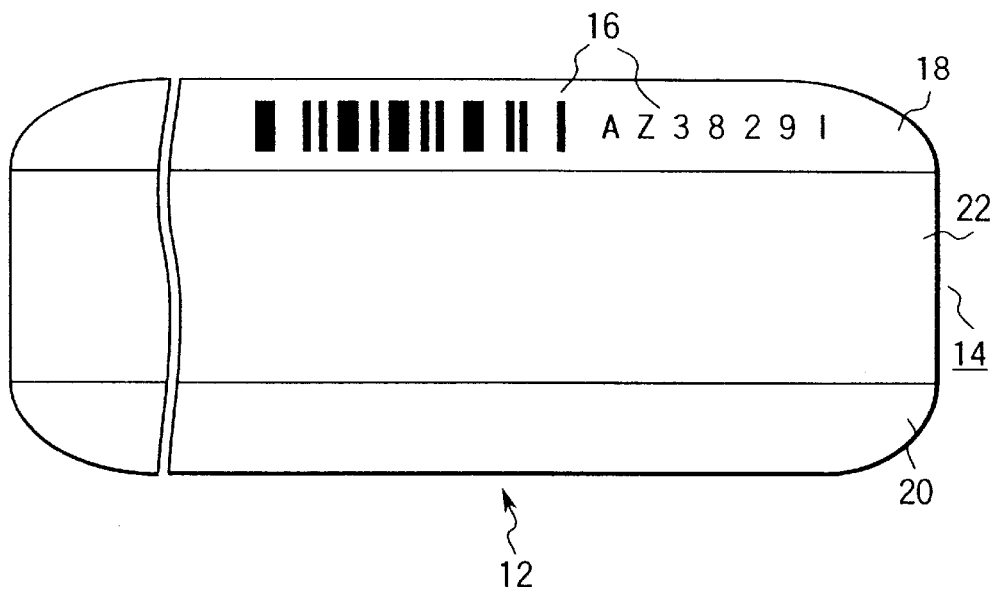
FIG. 1 is a side view of a part of a semiconductor wafer with an identification indication formed on a side surface of the semiconductor wafer according to a first embodiment of the present invention with the identification indication shown in the front of the figure.
Figure 2:
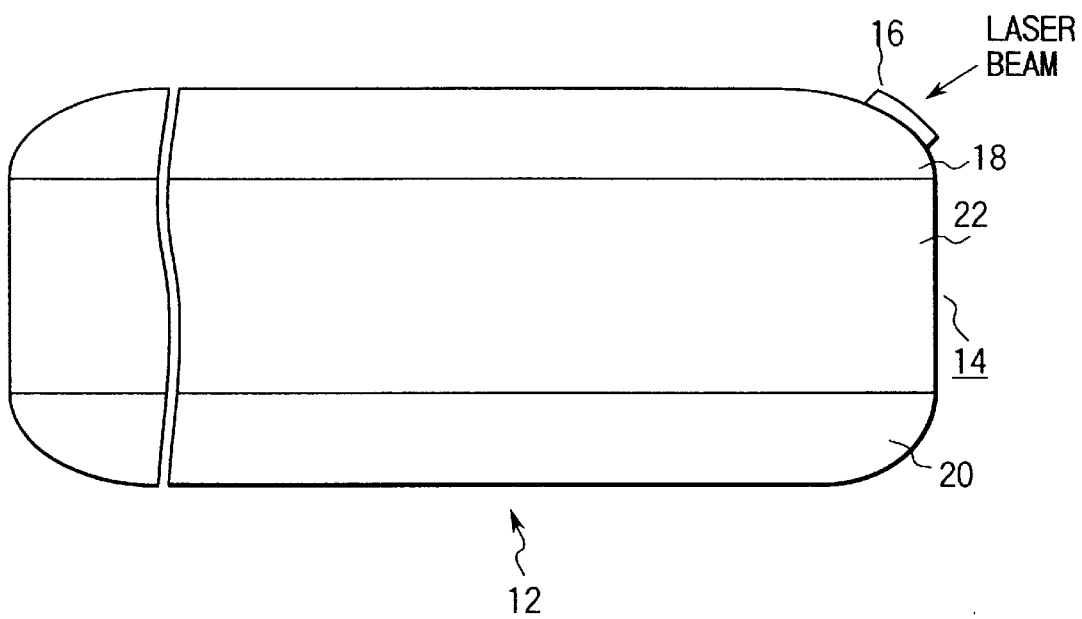
FIG. 2 is a side view of a part of a semiconductor wafer with an identification indication formed on a side surface of the semiconductor wafer according to the first embodiment of the present invention with the identification indication shown in the side of the figure.

FIGS. 1 and 2 show a side surface 14 of a wafer 12 of a first embodiment of the present invention. FIGS. 1 and 2 show an indication 16 (identification indication) for identifying the wafer 12 formed on a selected portion (selected side surface portion) 18 of the wafer side surface 14 in the front and the side, respectively.

The wafer 12 is applied with an independent identification indication 16 for identifying the semiconductor wafer 12 before the semiconductor circuit forming treatment. The identification indication 16 is formed by engraving the semiconductor wafer 12 by the laser beam radiation so as to be recognized by the outline of the engraving. The identification indication 16 includes a combination of bar codes appropriate for reading optically and numerals and alphabets appropriate for reading visibly. Unlike conventional technology, the indication is not formed on the front surface or the rear surface of the semiconductor wafer 12 as in the first embodiment, but on the selected side surface portion 18 of the semiconductor wafer 12 by engraving by the laser beam radiation in this invention as shown in FIGS. 1 and 2. Various treatment processes are conducted for forming the semiconductor circuit in each chip area on the surface of the semiconductor wafer 12 with the identification indication 16 formed thereon. The treatment processes include abrading or flattening processes such as an oxide film formation process, a metal film formation process, a heating process, a resist application process, a piercing process, a lithography process, an ion injection process, a CMP, and the like. In the case the identification indication 16 defined by the engraving outline is formed on the surface of the semiconductor wafer 12 in the conventional technology, the outline of the identification indication 16, that is, the engraving disappears or becomes unclear by the treatment processes so that it cannot be recognized. Moreover, a wrapping treatment is applied on the semiconductor wafer 12 from the rear surface preceding the packaging. By the wrapping treatment, the wafer 12 is thinned from, in general, about 725 um to about 300 um. That is, the wafer 12 becomes thinner. By the wrapping treatment, in the case the identification indication 16 is formed on the rear surface of the semiconductor wafer 12 as in the conventional technology, the identification indication 16 completely disappears.

However, unlike the conventional technology, since the identification indication 16 is not formed on the front surface or the rear surface of the semiconductor wafer 12, but on the side surface 14 of the semiconductor wafer 12 as shown in FIGS. 1 and 2 (the first embodiment) in the present invention. More specifically, the identification indication 16 is formed on the selected side surface portion 18 of the semiconductor wafer 12. Since the identification indication 16 is formed on the side surface 14 of the semiconductor wafer 12, even if various treatment processes are repeatedly conducted for forming a semiconductor circuit in each chip area on the wafer 12 surface as in the conventional technology, the identification indication 16, that is, the engraving cannot disappear or become unclear by the treatment processes. Moreover, the engraving formed on the selected side surface portion 18 of the side surface 14 of the semiconductor wafer 12 cannot disappear or become unclear by the wrapping treatment on the rear surface of the semiconductor wafer 12. Accordingly, since the identification indication 16 is formed on the side surface 14 of the semiconductor wafer 12 as shown in FIGS. 1 and 2 but not on the front surface or the rear surface of the semiconductor wafer 12, the identification indication 16 formed on the side surface 14 of the semiconductor wafer 12 cannot disappear or become unclear but can be maintained so as to be recognizable clearly even if various treatment processes are repeatedly conducted for forming a semiconductor circuit in each chip area on the wafer 12 surface as in the conventional technology, or by the wrapping treatment on the rear surface of the semiconductor wafer 12. Accordingly, the identification indication 16 by engraving can be maintained to be recognized sufficiently clearly until the process where the wafer 12 is cut into chips. The identification indication 16 is preferably engraved by a laser beam radiation as in the conventional technology.

In the first embodiment shown in FIGS. 1 and 2, the identification indication 16 is formed on the upper slant face portion 18 elongating from the front surface of the semiconductor wafer 12, which is the selected side surface portion of the semiconductor wafer 12. That is, the side surface 14 of the semiconductor wafer 12 has, in general, as shown in FIGS. 1 and 2, a slant face portion 18 elongating from the front surface of the wafer 12, a lower slant face portion 20 elongating from the rear surface, and a peripheral surface portion 22 between the slant face portion 18 elongating from the front surface and the lower slant face portion 20 elongating from the rear surface. In the first embodiment shown in FIGS. 1 and 2, the identification indication 16 is formed on the slant face portion 18 elongating from the front surface. This portion is a side surface portion of the wafer to remain after the wrapping treatment of the wafer 12, that is, the abrading treatment for the wafer 12 rear side for thinning the wafer 12. As shown in FIGS. 1 and 2, the upper slant face portion 18 and the lower slant face portion 20 form a curved surface. The same is applied to the other embodiment. In general, the thickness of the peripheral surface portion 22 of the semiconductor wafer 12 is 385 gin, and the thickness of the upper slant face portion 18 and the lower slant face portion 20 is 170 mm.

Figure 3:
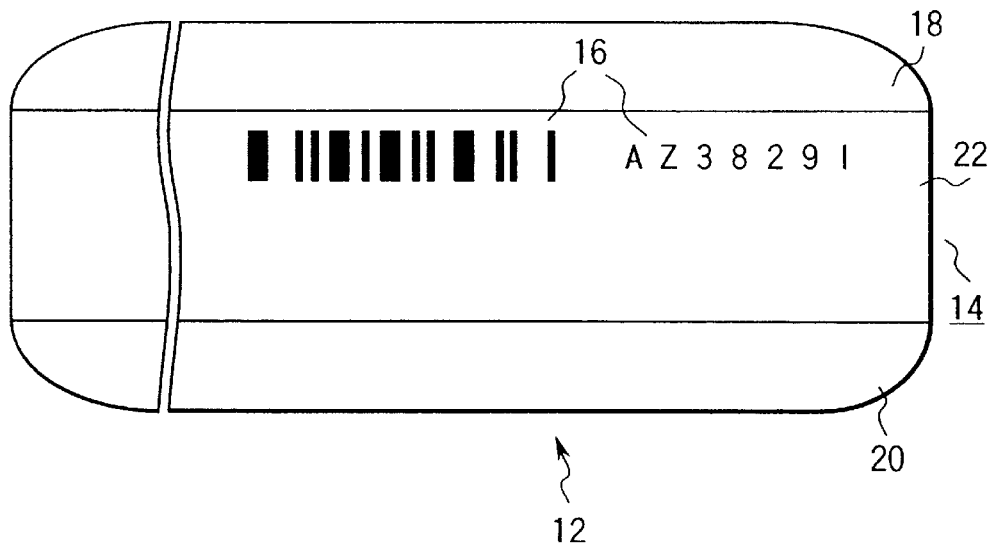
FIG. 3 is a side view of a part of a semiconductor wafer with an identification indication formed on a side surface of the semiconductor wafer according to a second embodiment of the present invention with the identification indication shown in the front of the figure.
Figure 4:
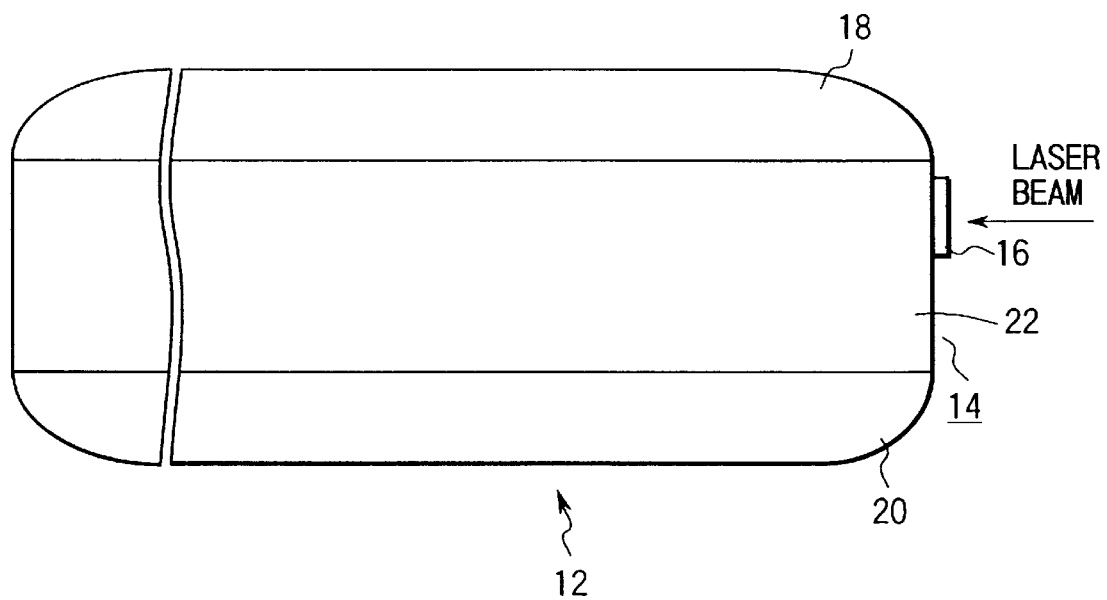
FIG. 4 is a side view of a part of a semiconductor wafer with an identification indication formed on a side surface of the semiconductor wafer according to the second embodiment of the present invention with the identification indication shown in the side of the figure.

FIGS. 3 and 4 show a side surface of a wafer 12 of a second embodiment of the present invention. FIGS. 3 and 4 show an identification indication 16 formed on a selected side surface portion of the wafer side surface 14 in the front and the side, respectively.

In the second embodiment shown in FIGS. 3 and 4, the identification indication 16 is formed on the peripheral surface portion 22, which is the selected side surface portion of the semiconductor wafer 12, between the upper slant face portion 18 elongating from the front surface and the slant face portion 20 elongating from the rear surface. Besides, it is formed in a portion close to the upper slant face portion 18 elongating from the front surface. This is a wafer 12 side surface portion to remain even after the wrapping treatment of the wafer 12, that is, the abrading treatment of the wafer 12 for thinning the wafer 12 from the rear side. That is, the semiconductor wafer 12 is cut and separated into chips after forming a semiconductor circuit in each chip area of the semiconductor wafer 12. Before the cutting and separating process, it is tested by a prober. Judgment is made on whether a product is good or defected by the test. Based on the result, only good products will be mounted on a package after thinning and cutting the wafer in a chip size. Then the wrapping treatment, that is, the back side grinding treatment is conducted so as to abrade the semiconductor wafer from the rear side for thinning the wafer 12 usually having about 725 um thickness to about 300 um thickness. By the wrapping treatment, the wafer 12 is thinned to about a half thickness so that about a half thickness portion of the rear side of the semiconductor is abraded and eliminated. That is, the portion close to the slant face portion 20 elongating from the rear surface in the peripheral portion 22 of the semiconductor wafer 12 is abraded and eliminated. Therefore, if the identification indication 16 is formed in this portion, it is abraded and eliminated before the semiconductor wafer 12 is cut and separated into chips. On the other hand, the identification indication 16 needs to be clearly recognized until the process where the wafer 12 is cut into chips. In the second embodiment, since the identification indication 16 is formed particularly in the portion close to the slant face portion 18 elongating from the front surface in the peripheral portion 22 of the side surface 14 of the semiconductor wafer 12, that is, in the wafer side surface portion to remain after the abrading treatment of the side surface 14 of the semiconductor wafer 12 from the wafer rear side for thinning the semiconductor wafer 12, the identification indication 16 formed on the side surface 14 of the semiconductor wafer 12 cannot disappear by the wrapping treatment on the rear side of the semiconductor wafer 12, but can be maintained so as to be recognized clearly. Accordingly, the identification indication 16 by engraving can be clearly recognized until the wafer 12 is cut into chips. Since the identification indication 16 formed on the side surface 14 of the semiconductor wafer 12 cannot disappear by the wrapping treatment on the rear side of the semiconductor wafer 12, the identification indication 16 cannot disappear by the wrapping treatment unlike the conventional technology where the identification indication 16 is formed on the rear side of the semiconductor wafer 12.

Figure 5:
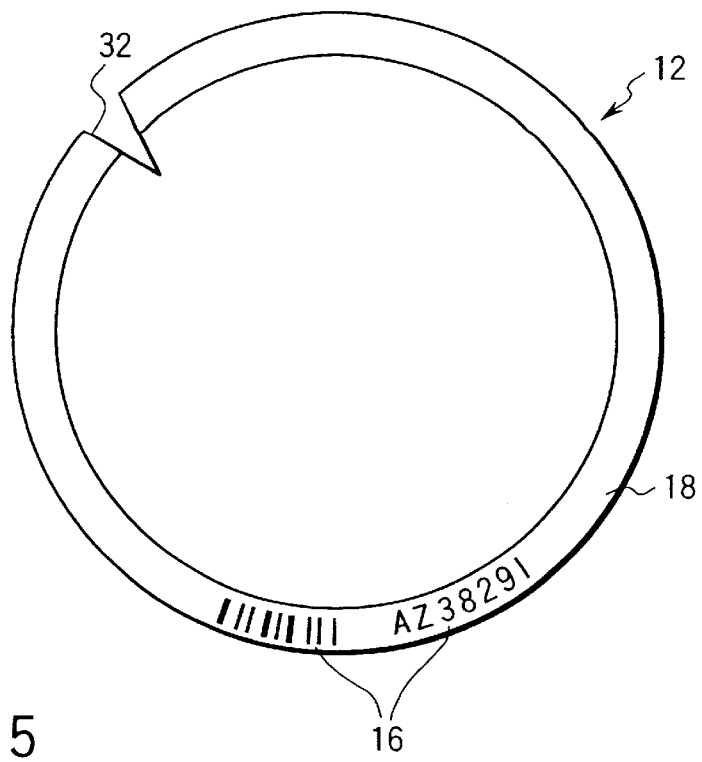
FIG. 5 is a plan view of the semiconductor wafer of the above-mentioned first embodiment of the present invention with the identification indication formed on the side of the semiconductor wafer, particularly showing an orienteering notch and the identification indication.

FIG. 5 is a plan view of the wafer 12 where the identification indication 16 is formed on the slant face portion 18 of the wafer side surface 14 elongating from the wafer front surface. In particular, it shows the orienteering notch 32 and the identification indication 16 of the wafer 12. As shown in the figure, it is preferable that the identification indication 16 is formed on a portion excluding the part where the orienteering notch 32 to be engaged with the hook of a wafer stage of a stepper device is formed.

Figure 6:
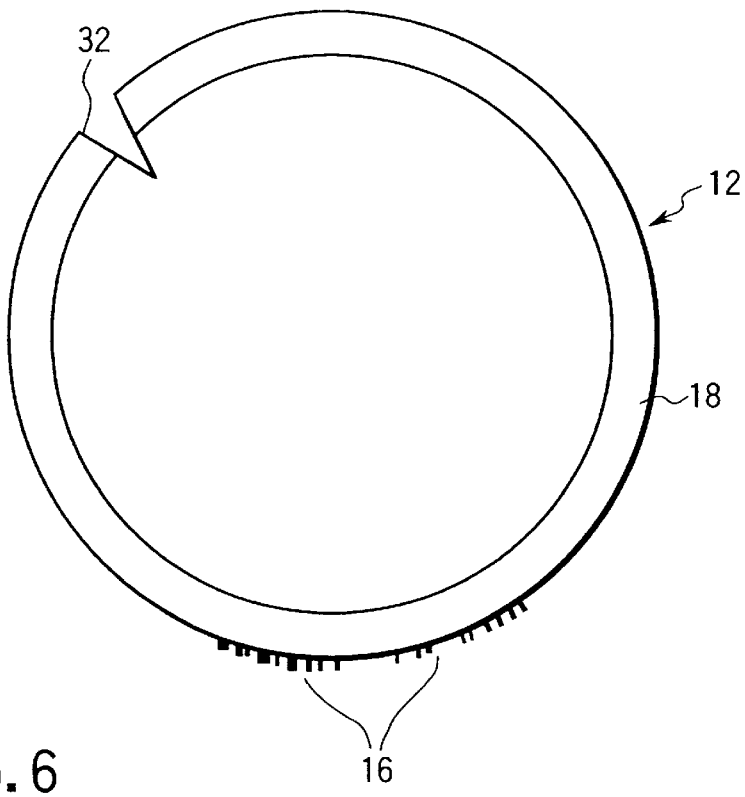
FIG. 6 is a plan view of the semiconductor wafer of the above-mentioned second embodiment of the present invention with the identification indication formed on the side of the semiconductor wafer, particularly showing an orienteering notch and the identification indication.

FIG. 6 is a plan view of the wafer with the identification indication 16 formed on the peripheral portion 22 of the wafer side surface 14. In particular, it shows the orienteering notch 32 and the identification indication 16 of the wafer 12. As shown in the figure, it is preferable that the identification indication 16 is formed on a portion excluding the part where the orienteering notch 32 is formed.

Figure 7:
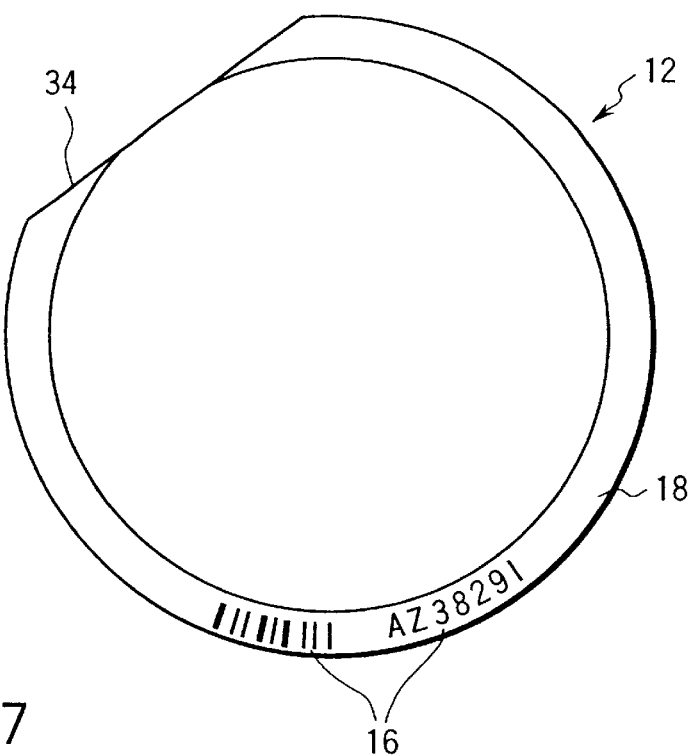
FIG. 7 is a plan view of the semiconductor wafer of the above-mentioned first embodiment of the present invention with the identification indication formed on the side of the semiconductor wafer, particularly showing an orienteering flat end portion and the identification indication.

FIG. 7 is a plan view of the wafer 12 with the identification indication 16 formed on the slant face portion 18 of the wafer side surface 14 elongating from the wafer front surface. In particular, it shows the orienteering flat end portion 34 and the identification indication 16 of the wafer 12. As shown in the figure, it is preferable that the identification indication 16 is formed on a portion excluding the part where the orienteering flat end portion 34.

Figure 8:
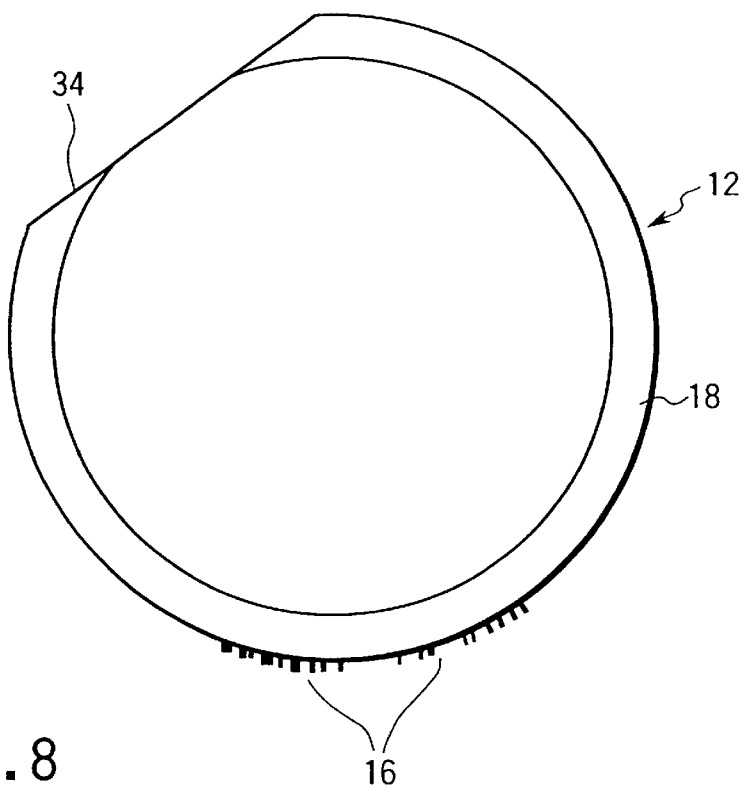
FIG. 8 is a plan view of the semiconductor wafer of the above-mentioned second embodiment of the present invention with the identification indication formed on the side of the semiconductor wafer, particularly showing an orienteering flat end portion and the identification indication.

FIG. 8 is a plan view of the wafer 12 with the identification indication 16 formed on the peripheral portion 22 of the wafer side surface 14. In particular, it shows the orienteering flat end portion 34 and the identification indication 16 of the wafer 12. As shown in the figure, it is preferable that the identification indication 16 is formed on a portion excluding the part where the orienteering flat end portion 34 is located.

With reference to FIGS. 9 to 13, the case of forming a semiconductor circuit in the semiconductor wafer 12 of the present invention will be explained with an example of a treatment process of forming an electrode wiring via a contact hole in the semiconductor wafer 12 with the identification indication 16 formed on the peripheral portion 22 of the semiconductor wafer 12.

Figure 9:
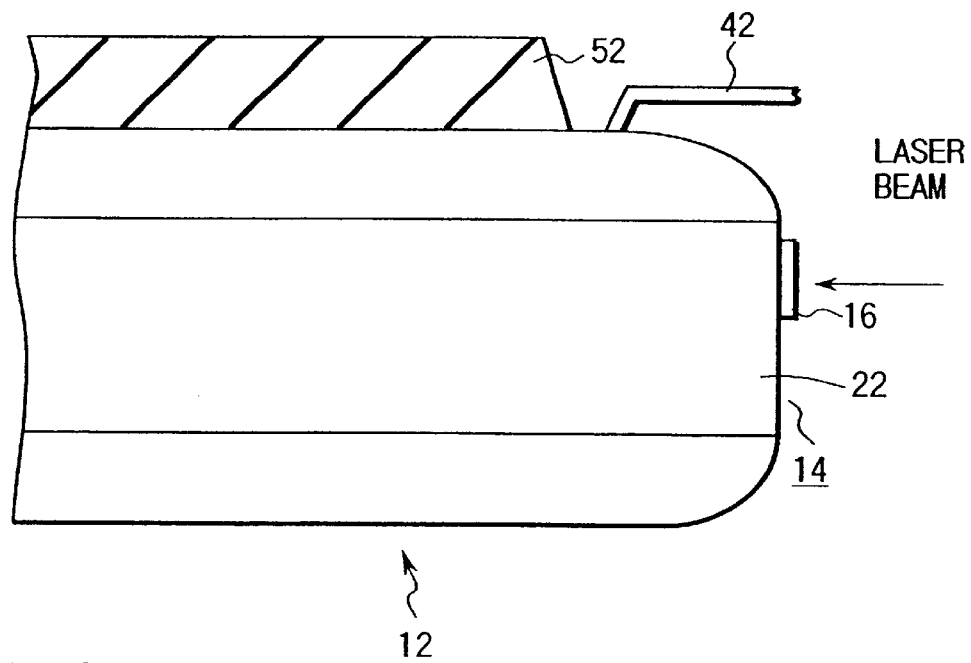
FIG. 9 is a cross-sectional view of the semiconductor wafer in a part of the treatment process for forming a semiconductor circuit in the semiconductor wafer according to the above-mentioned second embodiment of the present invention with the identification indication formed on the side of the semiconductor wafer.
Figure 10:
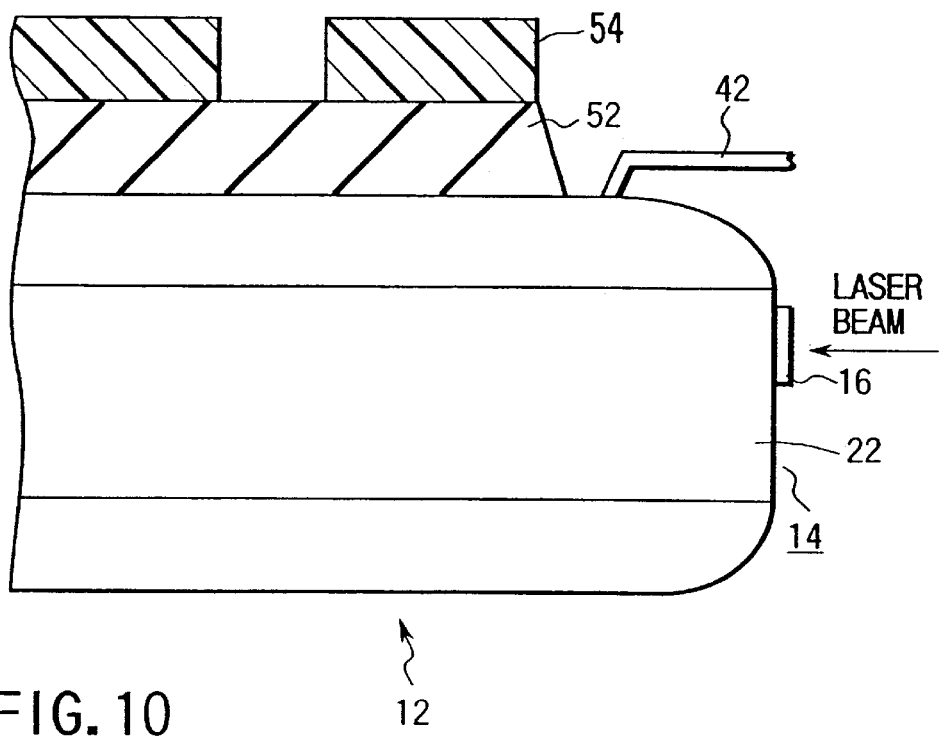
FIG. 10 is a cross-sectional view of the semiconductor wafer in a part of the treatment process for forming a semiconductor circuit in the semiconductor wafer according to the above-mentioned second embodiment of the present invention with the identification indication formed on the side of the semiconductor wafer.
Figure 11:
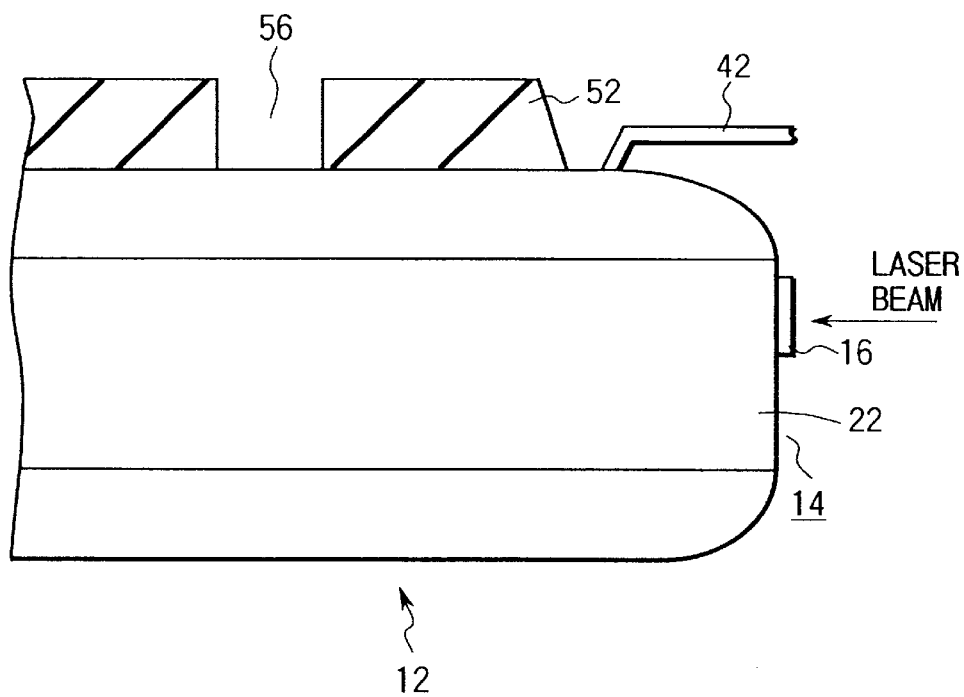
FIG. 11 is a cross-sectional view of the semiconductor wafer in a part of the treatment process for forming a semiconductor circuit in the semiconductor wafer according to the above-mentioned second embodiment of the present invention with the identification indication formed on the side of the semiconductor wafer.
Figure 12:
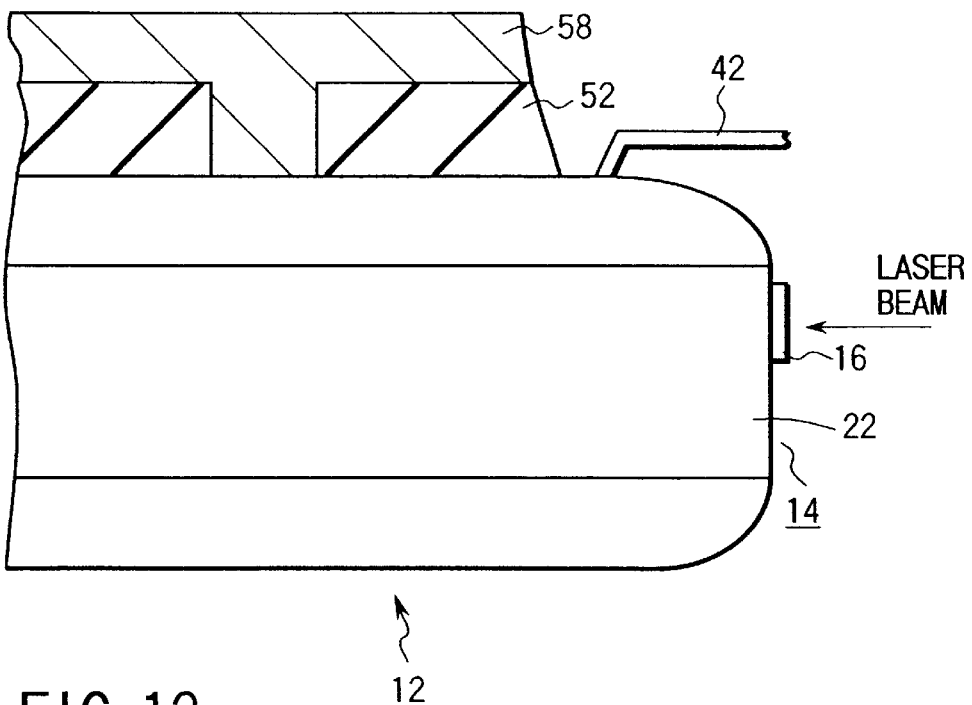
FIG. 12 is a cross-sectional view of the semiconductor wafer in a part of the treatment process for forming a semiconductor circuit in the semiconductor wafer according to the above-mentioned second embodiment of the present invention with the identification indication formed on the side of the semiconductor wafer.
Figure 13:
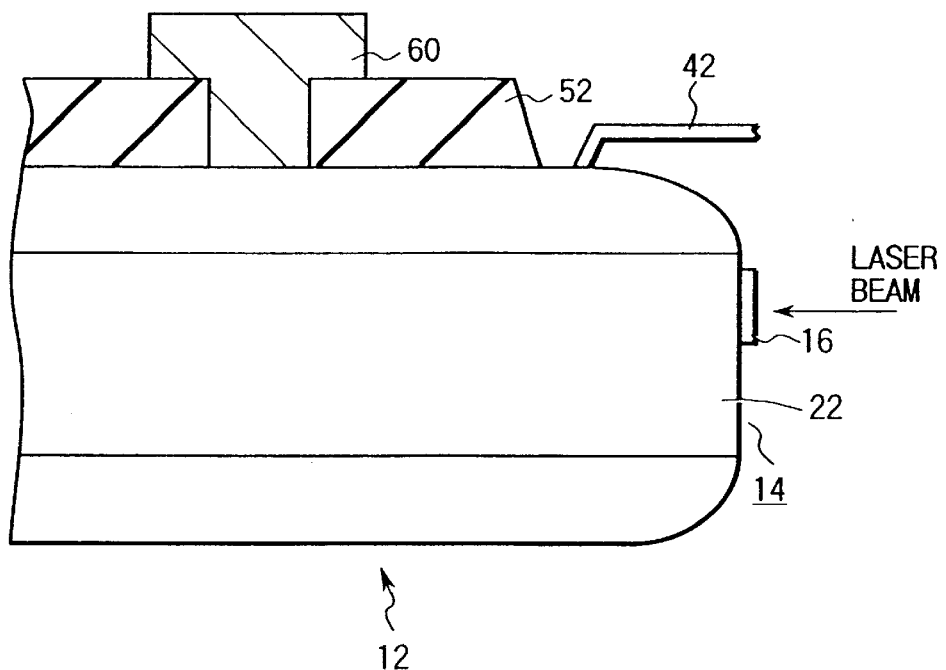
FIG. 13 is a cross-sectional view of the semiconductor wafer in a part of the treatment process for forming a semiconductor circuit in the semiconductor wafer according to the above-mentioned second embodiment of the present invention with the identification indication formed on the side of the semiconductor wafer.
Figure 14:
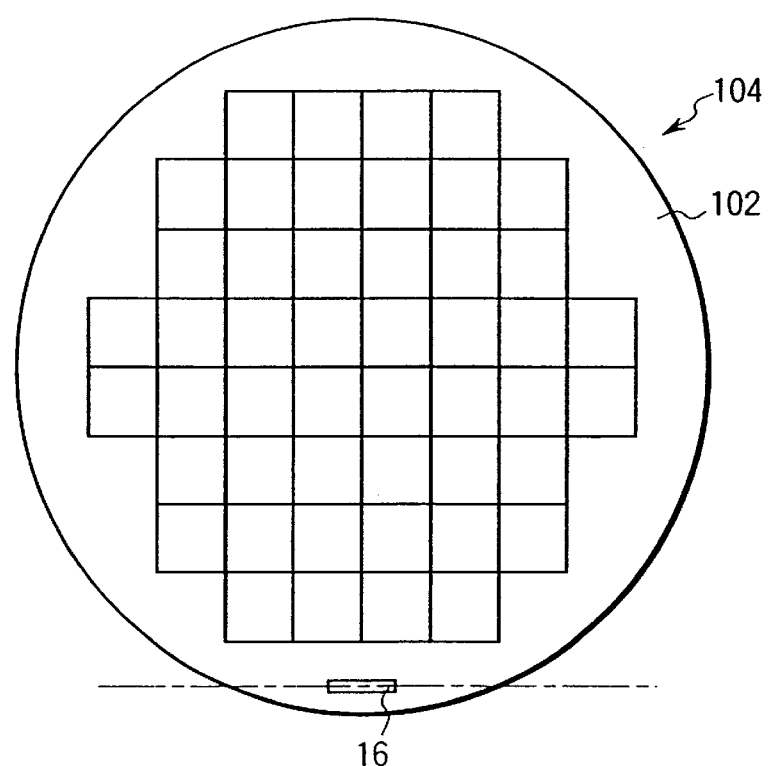
FIG. 14 is a plan view of a conventional semiconductor wafer with the identification indication formed on the surface of the semiconductor wafer.
Figure 15:
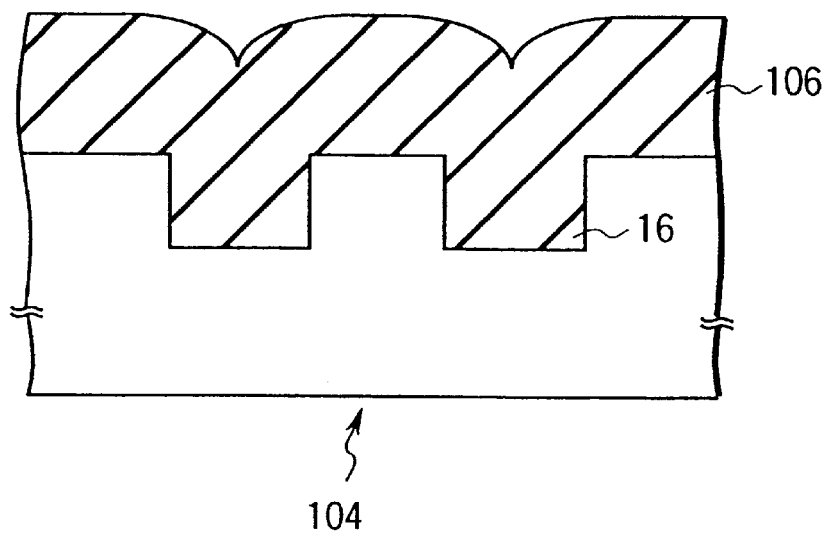
FIG. 15 is an enlarged cross-sectional view of a part of the engraving of the identification indication of the semiconductor wafer shown in FIG. 14.
Figure 16:
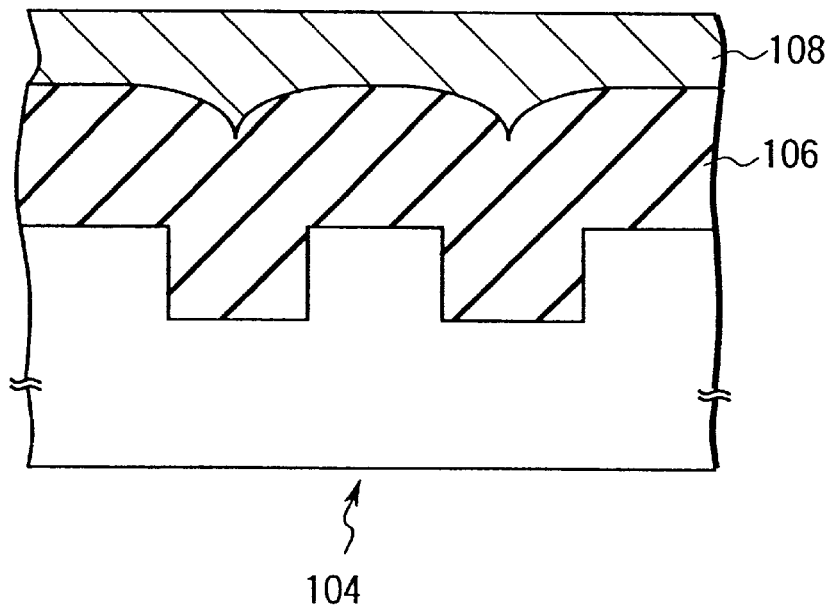
FIG. 16 is a cross-sectional view of another example of FIG. 14.
Figure 17:
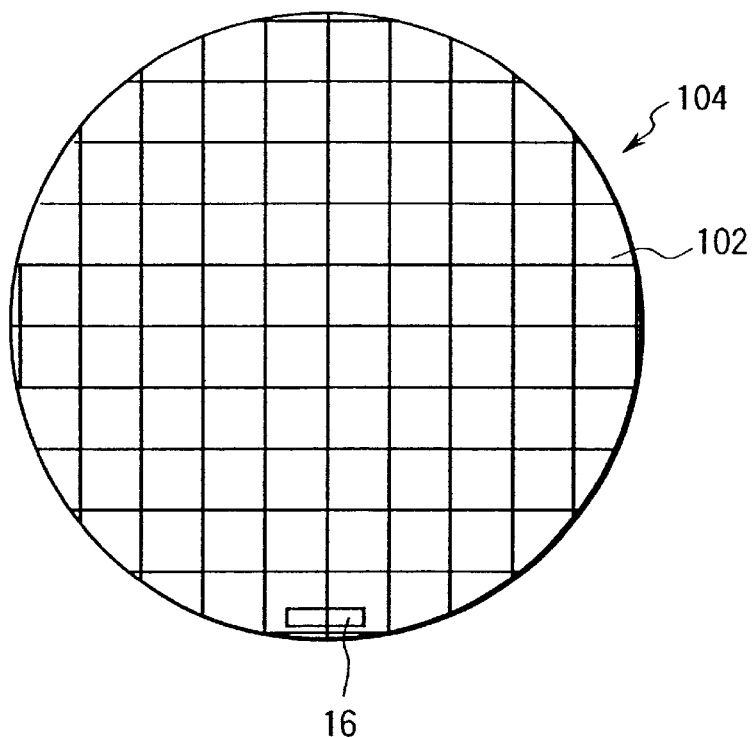
FIG. 17 is a plan view of another conventional semiconductor wafer with the identification indication formed on the surface of the semiconductor wafer.
Figure 18:
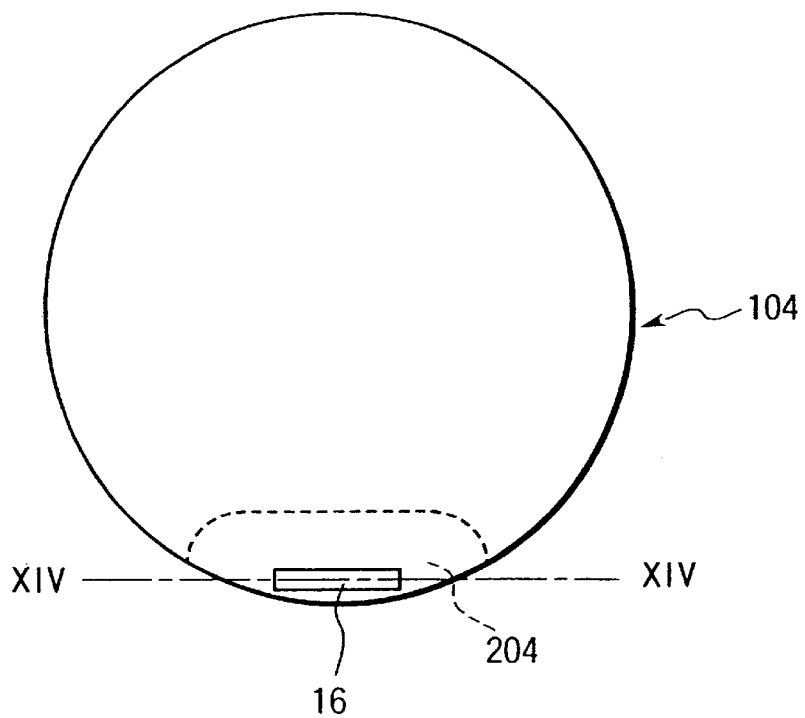
FIG. 18 is a plan view of a conventional semiconductor wafer with the identification indication formed on the surface of the semiconductor wafer.
Figure 19:
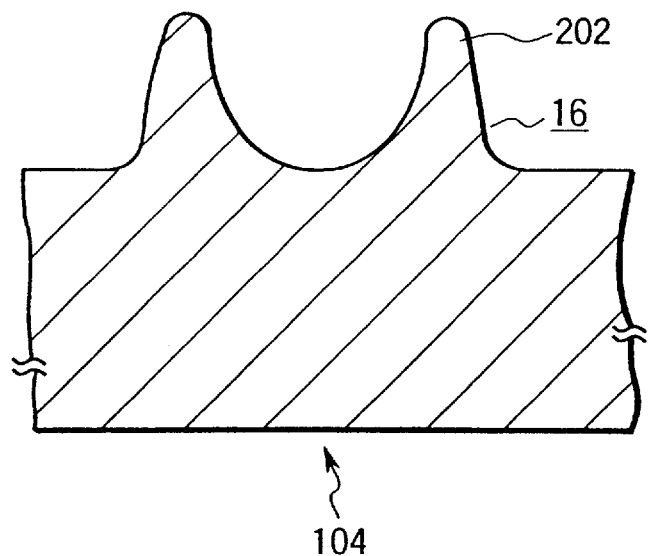
FIG. 19 is an enlarged cross-sectional view of a part of the engraving portion of the identification indication of the semiconductor wafer shown in FIG. 18.
Figure 20:
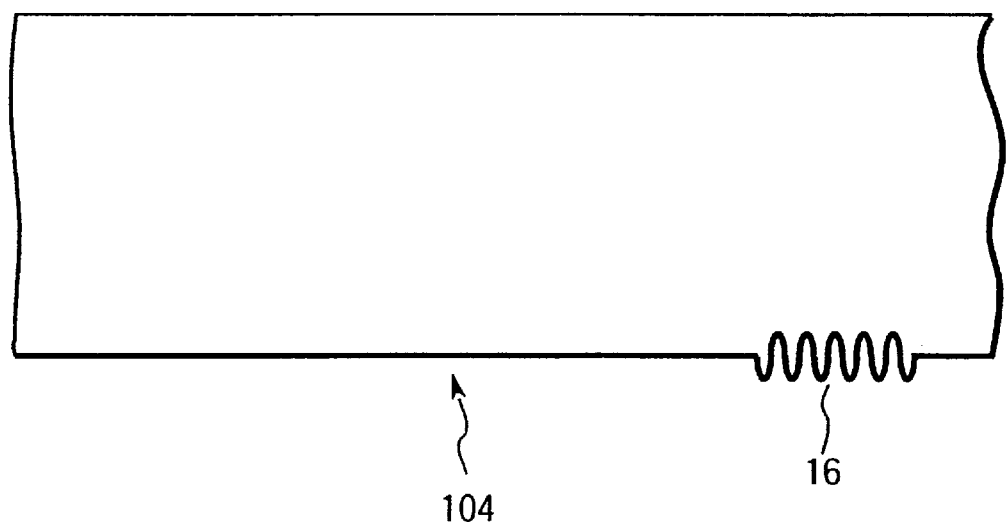
FIG. 20 is a side view of another conventional semiconductor wafer with the identification indication formed on the rear surface of the semiconductor wafer.

As shown in FIG. 9, the identification indication 16 is formed on the peripheral portion 22 of the semiconductor wafer 12 by engraving by the laser light radiation. Preceding the semiconductor circuit formation, the semiconductor wafer portion where the identification indication 16 is formed is covered with a cover member 42 provided in a wafer supporting device (not illustrated). This is to avoid the risk of, for example, having the identification indication 16 for becoming unclear by the effect of adhesion of the layer material in the treatment process of forming the semiconductor circuit. Then, an insulating film 52 is formed on the entire surface of the semiconductor wafer 12 by the heat oxidation treatment or the CVD treatment. A resist is applied on the entire surface of the insulating film. By patterning the formed resist layer, a resist pattern 54 is formed as shown in FIG. 10. By using the resist pattern as a mask, a contact hole 56 is formed on the insulating film 52 as shown in FIG. 11. By forming a metal film, such as an AI film 58 on the entire surface of the wafer including the insulating film 52 by the CVD method as shown in FIG. 12, and patterning the metal film 58, an electrode wiring 60 connected with the semiconductor wafer can be formed via the contact hole 56, as shown in FIG. 13. All the treatment processes are applied on the front surface of the semiconductor wafer 12. Since the identification indication 16 is formed on the peripheral portion 22 of the semiconductor wafer 12, the identification indication 16 hardly suffer the effect of the treatment processes. Therefore, the identification indication 16 can be clearly recognized in the treatment processes. Besides, since the semiconductor wafer portion where the identification indication 16 is formed is covered with the cover member 42, the effect of the treatment processes on the identification indication 16 can be further reduced. In the treatment, examination is conducted after each process on whether the treatment was conducted normally or a defect was generated. In this case, in the present invention, since the identification indication 16 can be clearly recognized in all the treatment processes, the semiconductor wafer 12 with a defect or the treatment process where the defect is generated can be detected with a high accuracy. That is, on which semiconductor wafer 12 the defect is generated or in which treatment process the defect is generated can be detected with a high accuracy. For example, in the above-mentioned treatment process, an examination is conducted on whether the insulating film 52 is normally formed or a defect is generated after the formation of the insulating film 52 so that in which semiconductor wafer 12 and in which treatment process that any defect is generated can be detected. Further, an examination is conducted on whether the contact hole 56 is normally formed or a defect is generated after the formation of the contact hole 56 so that in which semiconductor wafer 12 and in which treatment process that any defect is generated can be detected. Similarly, an examination is conducted on whether the metal film 58 is normally formed or a defect is generated after the formation of the metal film 58 so that in which semiconductor wafer 12 and in which treatment process that any defect is generated can be detected. Moreover, after forming the electrode wiring 60 by patterning the metal film 58, an examination is conducted on whether the electrode wiring 60 is normally formed or a defect is generated so that in which semiconductor wafer 12 and in which treatment process that any defect is generated can be detected. Accordingly, since a semiconductor wafer 12 where a defect is generated and a treatment process where the defect is generated can be detected after each treatment process, modification of the defect can be enabled or implementation of a meaningless treatment process after detecting the defect or a meaningless final examination can be avoided. The semiconductor wafer 12 treated as heretofore mentioned is applied with a further treatment process for forming a semiconductor circuit. After completing the semiconductor circuit, the semiconductor wafer 12 is cut and separated into chips. In this embodiment, since the identification indication 16 is formed on the peripheral portion 22 of the semiconductor wafer 12, in the treatment process for completing the semiconductor circuit, the identification indication 16 can still be readily read in the cutting and separating process.

The identification indication 16 can be readily read by a bar code reader, an image treatment by taking in the image, or a laser reading device as in the conventional technology.

The treatment process for forming the electrode wiring 60 via the contact hole 56 on the semiconductor wafer 12 where the identification indication 16 is formed on the periphery portion 22 of the semiconductor wafer 12 has been explained with reference to FIGS. 9 to 13. Since the treatment process for forming an electrode wiring via a contact hole on the semiconductor wafer 12 where the identification indication 16 is formed on the upper slant face portion 18 elongating from the front surface of the semiconductor wafer 12 (FIGS. 1 and 2) is the same, further explanation is not provided. In that case, the same effect mentioned with reference to FIGS. 9 to 13 can be achieved.

The present invention is not limited to the above-mentioned embodiments, but for example, as the identification indication 16, a bar code or a combination of numerals and letters can be used. Or only numerals or only letters can be used. Or only a combination of numerals and letters can be used. Or a combination of various marks can be used. The identification indication 16 can be provided not only for one part but for a plurality of parts.

According to the present invention, since the identification indication 16 is provided on the side surface 14 of the semiconductor wafer 12, even if various treatment processes are repeatedly conducted for forming a semiconductor circuit in each chip area, or even by the wrapping treatment to the rear side of the wafer 12, the identification indication 16 formed on the side surface 14 of the semiconductor wafer 12 cannot disappear or become unclear, and thus the identification indication 16 can be recognized clearly at least until the process for cutting the wafer 12 into chips.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
    forming a semiconductor wafer identification on a selected side surface portion of each of a plurality of semiconductor wafers, the identification remaining after abrading said each semiconductor wafer on a rear surface to make said each semiconductor wafer thinner,
    performing treatments to form a semiconductor circuit on a chip area portion of said each semiconductor wafer, and
    after each of the treatments, testing whether a defect is generated in said each semiconductor wafer and reading the identification of a semiconductor wafer in which a defect is generated.

2. The method of manufacturing a semiconductor device according to claim 1, wherein the side surface of said each semiconductor wafer comprises a slant face portion elongating from the front surface, a slant face portion elongating from the rear surface, and a peripheral surface portion between the slant face portion elongating from the front surface and the slant face portion elongating from the rear surface, and wherein the selected side surface portion is the slant face portion elongating from the front surface.

3. The method of manufacturing a semiconductor device according to claim 1, wherein the side surface of said each semiconductor wafer comprises a slant face portion elongating from the front surface, a slant face portion elongating from the rear surface, and a peripheral surface portion between the slant face portion elongating from the front surface and the slant face portion elongating from the rear surface, and wherein the selected side surface portion is a portion at the side close to the slant face portion elongating from the front surface.

4. The method of manufacturing a semiconductor device according to claim 1, wherein the identification is an engraving formed on the selected side surface portion of said each semiconductor wafer.

5. The method of manufacturing a semiconductor device according to claim 4, wherein the engraving is formed by applying laser beam radiation to the selected side surface portion of said each semiconductor wafer.

6. The method of manufacturing a semiconductor device according to claim 5, wherein the identification comprises a visibly recognizable identification.

7. The method of manufacturing a semiconductor device according to claim 6, wherein the visibly recognizable identification comprises at least one of a numeral or a mark.

8. The method of manufacturing a semiconductor device according to claim 1, wherein the identification comprises an optically recognizable identification.

9. The method of manufacturing a semiconductor device according to claim 8, wherein the optically recognizable identification comprises a bar code.

* * * * *